United States Patent [19]

Resneau et al.

[11] 4,440,828

[45] Apr. 3, 1984

[54] SUBSTRATE FOR A MICROWAVE ELECTRONIC CIRCUIT AND A METHOD FOR THE MAKING OF SAID SUBSTRATE

[75] Inventors: Jean-Claude Resneau; Pierre Roset; Jean Doyen, all of Paris, France

[73] Assignee: Thomson-CSF, Paris, France

[21] Appl. No.: 484,994

[22] Filed: Apr. 14, 1983

[30] Foreign Application Priority Data

Apr. 16, 1982 [FR] France ................................ 82 06599

[51] Int. Cl.³ ...................... H01M 6/20; H01M 2/16
[52] U.S. Cl. .................................... 428/334; 428/698; 428/427; 428/433
[58] Field of Search ..................... 427/126.3; 428/427, 428/433, 698, 334

[56] References Cited

U.S. PATENT DOCUMENTS

| | | | |
|---|---|---|---|
| 3,564,565 | 2/1971 | Haberecht et al. | 428/698 X |
| 4,096,297 | 6/1978 | Pappis et al. | 428/698 X |
| 4,360,578 | 11/1982 | McCoy | 427/126.3 X |

FOREIGN PATENT DOCUMENTS 357510 4/1930 United Kingdom ................ 428/698

*Primary Examiner*—George F. Lesmes
*Assistant Examiner*—Nancy A. B. Swisher
*Attorney, Agent, or Firm*—Cushman, Darby & Cushman

[57] ABSTRACT

The substrate is formed by a plate of boron nitride having a composition of 42% B, 53.5% $N_2$, containing between 1.5 and 2.5% $O_2$, and 1.5% Ca. The surface is increased in hardness and made non-friable by deposition of a glass film to a depth within the range of 10 to 15 microns. This deposit permits surface metallization and ensures cohesion of the boron nitride grains.

5 Claims, No Drawings

SUBSTRATE FOR A MICROWAVE ELECTRONIC CIRCUIT AND A METHOD FOR THE MAKING OF SAID SUBSTRATE

This invention relates to a substrate for electronic circuits which operate in the microwave frequency range, such as hybrid circuits. The invention is also concerned with a method for making such a substrate.

For microwave electronic circuits, it is known to use quartz which is subject however, to two types of defects:

quartz only allows the fabrication of small size substrates;

quartz has thermal characteristics which make it sensitive to thermal shock;

quartz has a very low coefficient of linear expansion in comparison with other materials which are used in that technology, thus making it very difficult and even impossible to use it in some cases;

quartz has very low heat conductivity in comparison with that of other materials like beryllium oxide or alumina.

In contrast, boron nitride is advantageous for the following reasons:

in accordance with known practice, boron nitride plates of large size can be sintered, thus making it possible to form substrates having dimensions, for example, of 300×125 mm across the sides, which is impossible in the case of quartz;

its dielectric characteristics (low dielectric constant $\epsilon$ and low loss tangent $tg\delta$) permit the production of lines having high impedance or make it possible to obtain lower losses between conductors in respect of a given impedance;

its thermal characteristics are comparable with those of materials in conjunction with which it is employed.

However, boron nitride cannot be metallized by conventional means such as thick-film deposits (silver, palladium silver, or platinum and so on), thin films deposited in vacuum or by chemical process. Boron nitride is in fact too soft at the surface and too friable. The cohesion of the grains at the surface of a boron nitride plate is insufficient and is comparable to that of a plaster surface, for example.

An object of the invention is to make it possible to use boron nitride as a metallized substrate.

An other object of the invention is to endow the boron nitride with a hard and non-friable surface by depositing a material to a given thickness, for example of the order of 10 to 15 microns, which ensures cohesion of the grains without impairing the electric and thermal characteristics of the boron nitride. A glass which is chosen so as to have a dielectric constant $\epsilon$ in the vicinity of the one of boron nitride and having a suitable coefficient of expansion is wholly satisfactory for this purpose. The glazed surface can then be metallized by conventional means.

According to the invention there is provided a substrate for a microwave circuit, comprising a plate comprising boron nitride having two large faces, and a glass film deposited at least on one of said faces, thereby permitting surface metallization of said face and ensuring cohesion of the grains of boron nitride.

Other features of the invention will be more apparent upon consideration of the following description which relates to one example of fabrication of large-size substrates for microwave circuits.

Among the different types of boron nitride (since this product is similar to ceramic materials in that it does not have a fixed composition), the type corresponding to a composition containing approximately 42% boron, 53.5% nitrogen, and different impurities including 1.5 to 2.5% oxygen and 1.5% calcium, has the following characteristics when it is sintered in the form of plates:

dielectric constant $\epsilon = 4.11$ loss factor $tg\delta = 10^{-3}$ for 1 MHz coefficient of linear expansion $7 \times 10^{-6}$ in the parallel direction, that is, in the direction of the longest dimensions of a substrate as opposed to the perpendicular direction corresponding to the thickness of the substrate thermal conductivity $= 0.15$ cal/cm$^2$/sec/°C./cm.

This kind of boron nitride is advantageous for the formation of substrates although its dielectric constant of 4.11 is slightly greater than that of quartz which is equal to 3.7. As stated earlier, however, boron nitride is too soft and too friable at the surface to ensure perfect adhesion of a metallization deposit.

According to the invention, the thermal and dielectric characteristics of a material of this type are not impaired but, on the contrary, its surface is made hard and non-friable by depositing a film-layer of glass chosen from glasses having a dielectric constant in the vicinity of the one of the quartz or the boron nitride.

The glass chosen becomes more similar to pure silica $SiO_2$ as the requisite characteristics for operation at microwave frequencies are more stringent. A practically pure silica, of high microwave quality, has a melting point in the vicinity of 1300° C. Depending on the intended use of the substrate or depending on the operating frequency it is also possible to employ a lightly doped glass having a melting temperature of the order of 700° C.

The glass which is chosen can be deposited in film-layers having a thickness of the order of only 10 to 15 microns by screen-process deposition of a conventional paste containing glass powder, binders and organic agents. This layer is then fired in a furnace at a temperature which is at least equal to the melting point of glass, and at which all the organic solvents are evaporated. The glass can also be deposited by radiofrequency cathodic sputtering in vacuum in accordance with the so-called thin-film technology, or else by chemical deposition in vapor phase at low pressures in accordance with the technology known as chemical vapor deposition (CVD).

The glass chosen for forming either a thin film or a layer of greater thickness of the order of 10 to 15 microns permits good cohesion of the boron nitride grains at the surface, thereby resulting in surface glazing or vitrification. The glass layer can be metallized in accordance with the thin-film technique, which means that the surface of the boron nitride substrate then has the ability to withstand the passing of the metallization screens during the screen-process deposition. By reason of its very small thickness, the glass layer does not carry any appreciable penalty in regard to thermal resistance of the functional device. Furthermore, the glass layer can be chosen so as to ensure that its coefficient of linear expansion is very close to that of the boron, thus preventing any subsequent breakaway or delaminations between the boron nitride layer and the glass layer during operation. In regard to its dielectric characteristics, $\epsilon$ and tg$\delta$, it is possible to adapt them to those of boron nitride according to the nature of the doping elements added to the glass. The result thereby achieved is that there is no dielectric discontinuity within the boron nitride substrate which is thus improved by the addition of a glass layer at the surface.

The invention has been described in the foregoing on the basis of a non-limitative example of a substrate having large dimensions, that is to say dimensions which cannot be attained in the case of a quartz substrate. However, the full value of the present invention remains unaffected if it is applied to a substrate having smaller dimensions down to what is conventionally designated as an insulating block of about the same size as a semiconductor chip, the block being located and bonded between the microwave semiconductor chip and an encapsulation housing. The fact that a substrate of this type can now be metallized makes it possible either to form metallized terminations for bonding semiconductor chips or to deposit conductive strips on said substrate in order to fabricate circuits which operate in the microwave frequency range in accordance with the so-called strip-line technology.

What is claimed is:

1. A substrate for a microwave circuit, comprising a plate comprising fused grains of boron nitride comprising 42% boron, 53.5% nitride, between 1.5 and 2.5% oxygen and 1.5% calcium having two large faces, and a thin glass film deposited at least on one face of said faces, thereby permitting surface metallization of said face and ensuring cohesion of the grains of born nitride wherein said glass film has a dielectric constant substantially equal to the dielectric constant of quartz or of said boron nitride.

2. A substrate according to claim 1, wherein said glass film has a thickness within the range of 10 to 15 microns.

3. A substrate according to claim 1, wherein said glass film has a dielectric constant substantially equal to the dielectric constant of quartz.

4. A substrate according to claim 1, wherein said glass film has a dielectric constant substantially equal to the dielectric constant of said boron nitride.

5. A substrate according to claim 1, wherein said glass film has a coefficient of linear thermal expansion substantially equal to the one of said boron nitride plate.

* * * * *